(12) United States Patent
Kozuru

(10) Patent No.: US 12,096,560 B2
(45) Date of Patent: Sep. 17, 2024

(54) SUBSTRATE MODULE OR LIGHT EMITTING MODULE

(71) Applicant: NICHIA CORPORATION, Anan (JP)

(72) Inventor: Kazuma Kozuru, Tokushima (JP)

(73) Assignee: NICHIA CORPORATION, Anan (JP)

( * ) Notice: Subject to any disclaimer, the term of this patent is extended or adjusted under 35 U.S.C. 154(b) by 750 days.

(21) Appl. No.: 17/344,370

(22) Filed: Jun. 10, 2021

(65) Prior Publication Data

US 2021/0392750 A1 Dec. 16, 2021

(30) Foreign Application Priority Data

Jun. 11, 2020 (JP) .................................. 2020-101645

(51) Int. Cl.
| | |
|---|---|
| *H05K 1/18* | (2006.01) |
| *H01R 12/79* | (2011.01) |
| *H01S 5/0239* | (2021.01) |
| *H05K 1/02* | (2006.01) |

(52) U.S. Cl.
CPC ............ *H05K 1/18* (2013.01); *H01S 5/0239* (2021.01); *H05K 1/0296* (2013.01); *H01R 12/79* (2013.01); *H05K 2201/10174* (2013.01); *H05K 2201/10189* (2013.01); *H05K 2201/10196* (2013.01); *H05K 2201/10522* (2013.01)

(58) Field of Classification Search
CPC .................................................. H05K 1/0296
See application file for complete search history.

(56) References Cited

U.S. PATENT DOCUMENTS

| | | | |
|---|---|---|---|
| 2012/0009973 A1* | 1/2012 | Demuynck ............ | H05K 1/183 29/832 |
| 2016/0190111 A1* | 6/2016 | Oyu ...................... | H01L 25/167 257/89 |
| 2019/0273357 A1 | 9/2019 | Hatano et al. | |
| 2020/0161828 A1 | 5/2020 | Hatano et al. | |

FOREIGN PATENT DOCUMENTS

| | | |
|---|---|---|
| JP | H10-284196 A | 10/1998 |
| JP | H11-344720 A | 12/1999 |
| JP | 2004-120149 A | 4/2004 |
| JP | 2013-105794 A | 5/2013 |
| JP | 2016-127154 A | 7/2016 |
| JP | 2019-153570 A | 9/2019 |

* cited by examiner

*Primary Examiner* — Tuan N Nguyen
(74) *Attorney, Agent, or Firm* — FOLEY & LARDNER LLP

(57) ABSTRACT

A substrate module includes: a substrate having top and bottom surfaces and comprising, at the top surface, a plurality of first wiring regions and a plurality of second wiring regions that are electrically connected to the plurality of first wiring regions; one or more power receiving devices disposed on the plurality of first wiring regions; a first connection component disposed on the plurality of second wiring regions, wherein the first connection component has opposite ends in a first direction; and a protected component disposed on the top surface of the substrate. In a top plan view, (i) the protected component is located between two straight lines passing through the respective opposite ends of the first connection component and extending in a second direction perpendicular to the first direction, and (ii) the protected component is located between the one or more power receiving devices and the first connection component.

9 Claims, 9 Drawing Sheets

[Fig. 1]
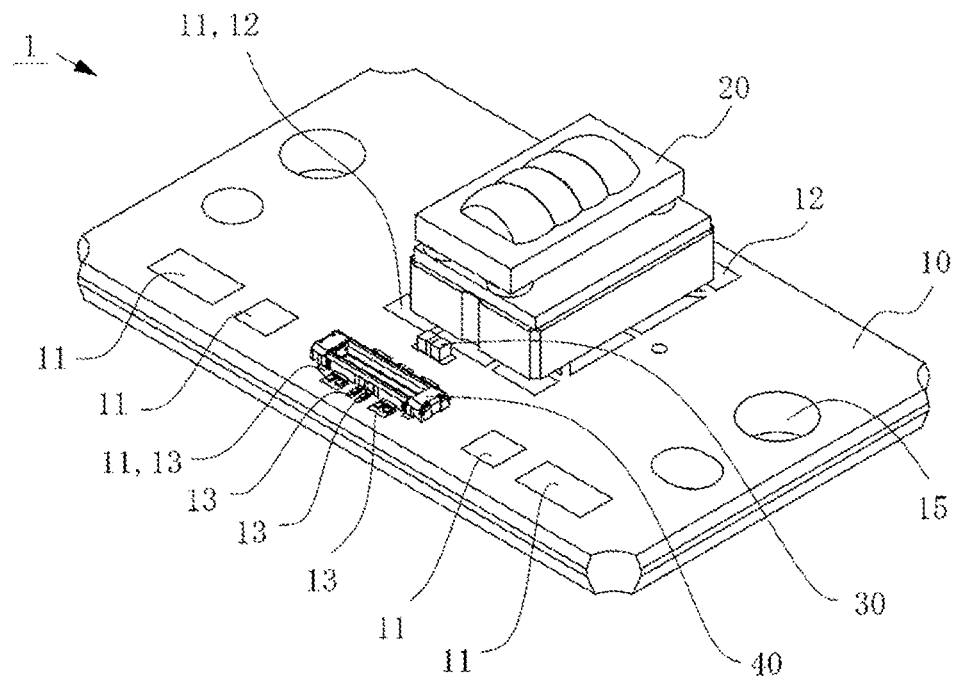
[Fig. 2]
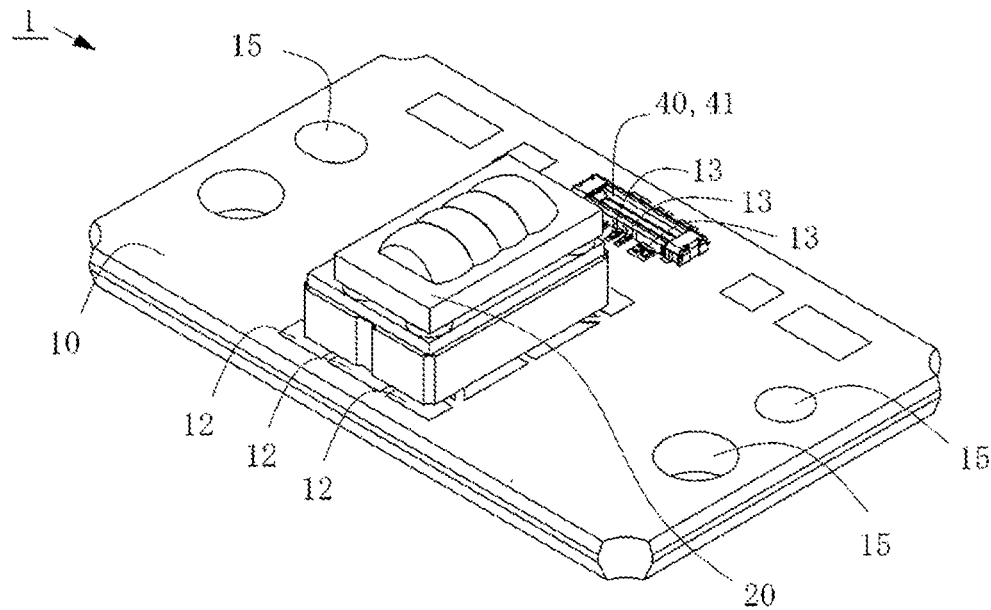

[Fig. 3]
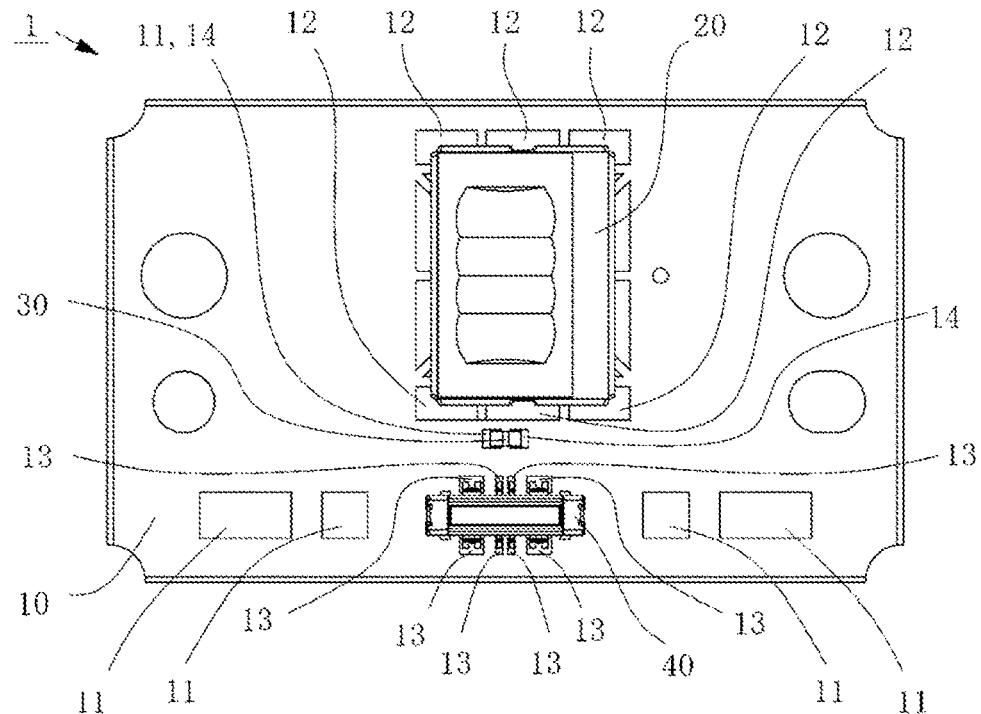
[Fig. 4]
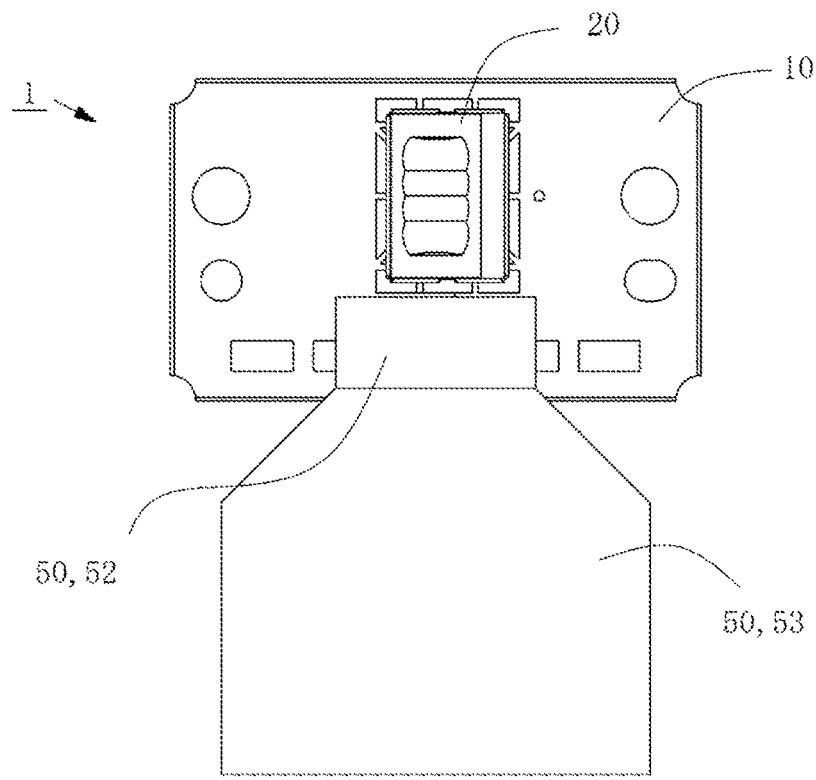

[Fig. 5]
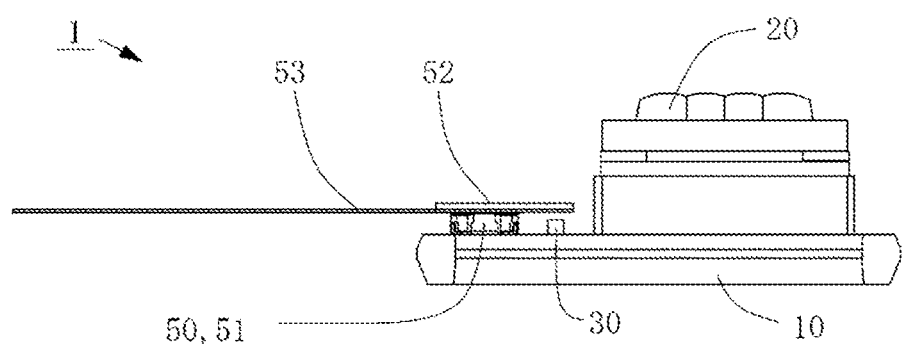
[Fig. 6]
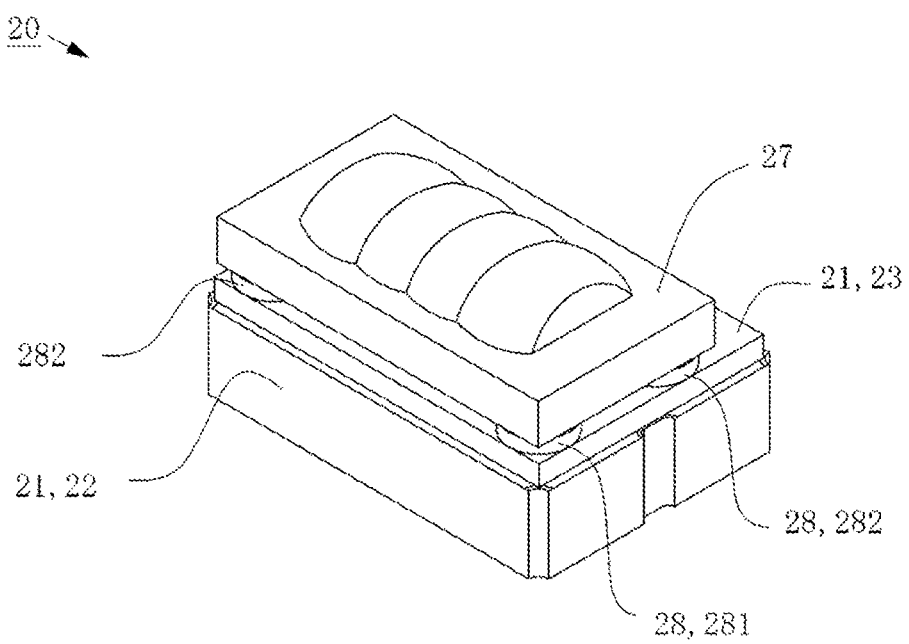

[Fig. 7]
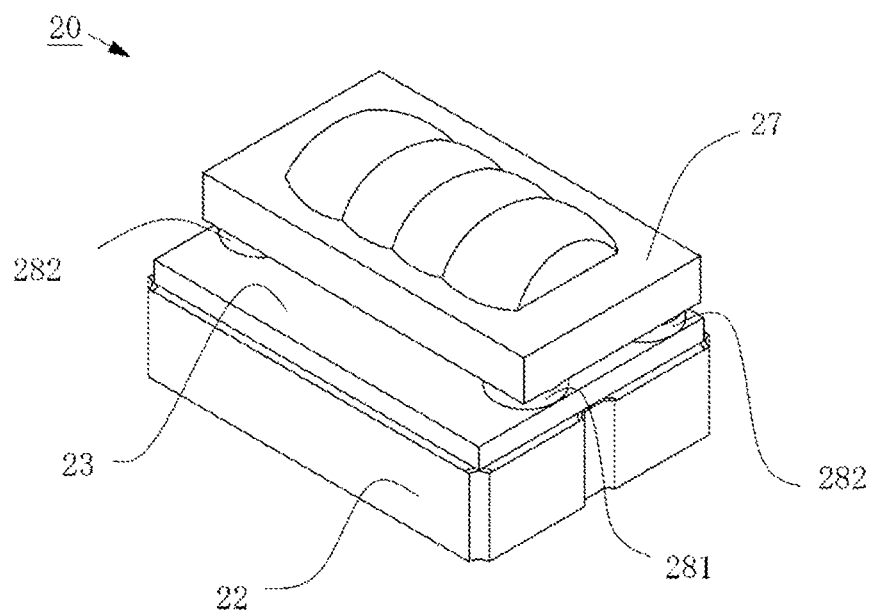
[Fig. 8]
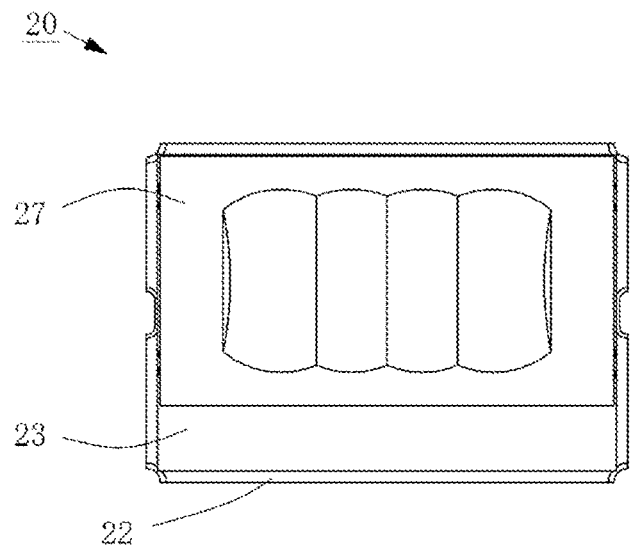

[Fig. 9]
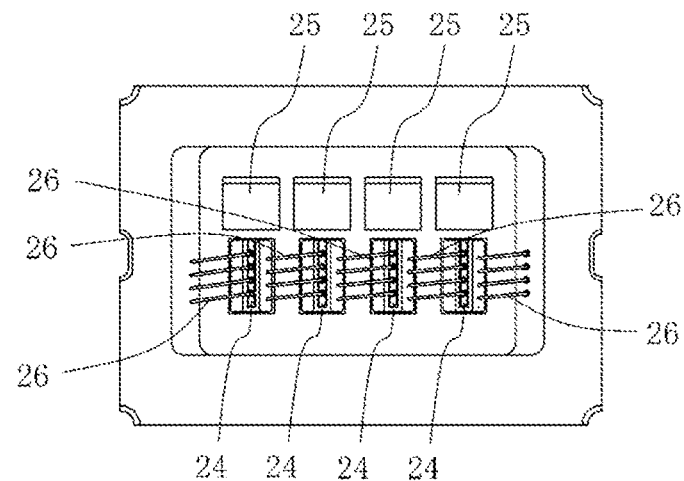
[Fig. 10]
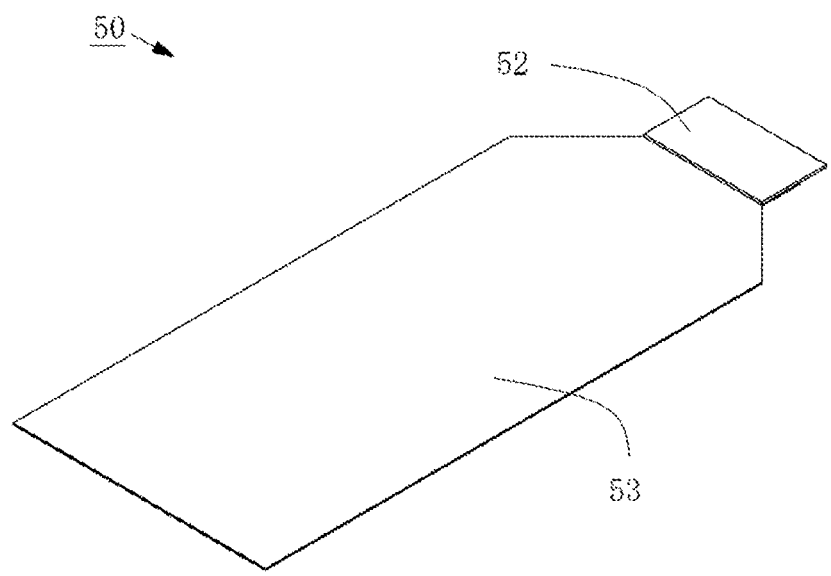

[Fig. 11]
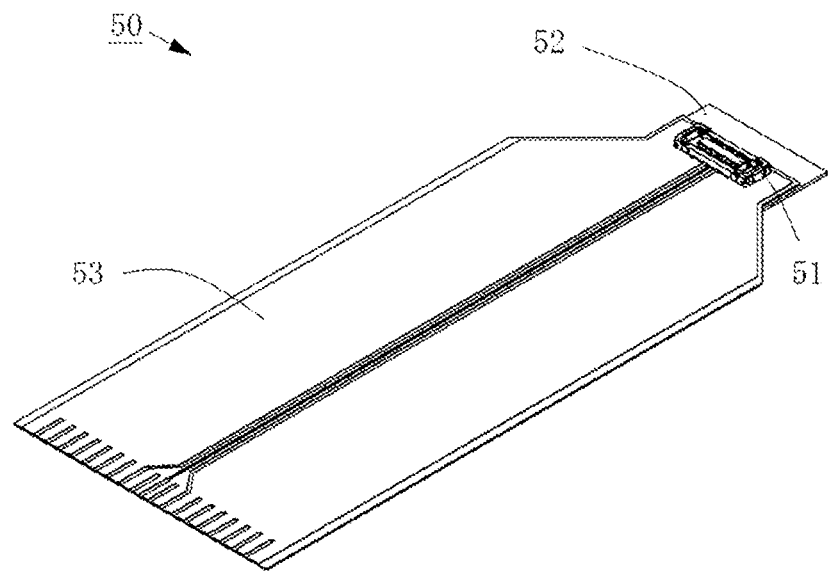
[Fig. 12]
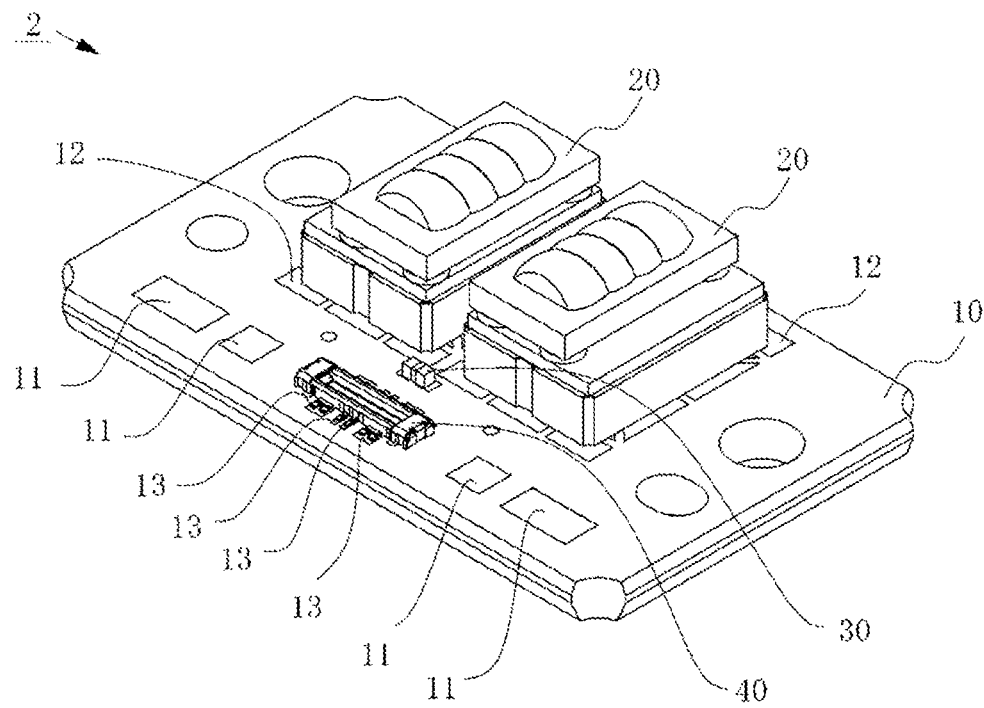

[Fig. 13]
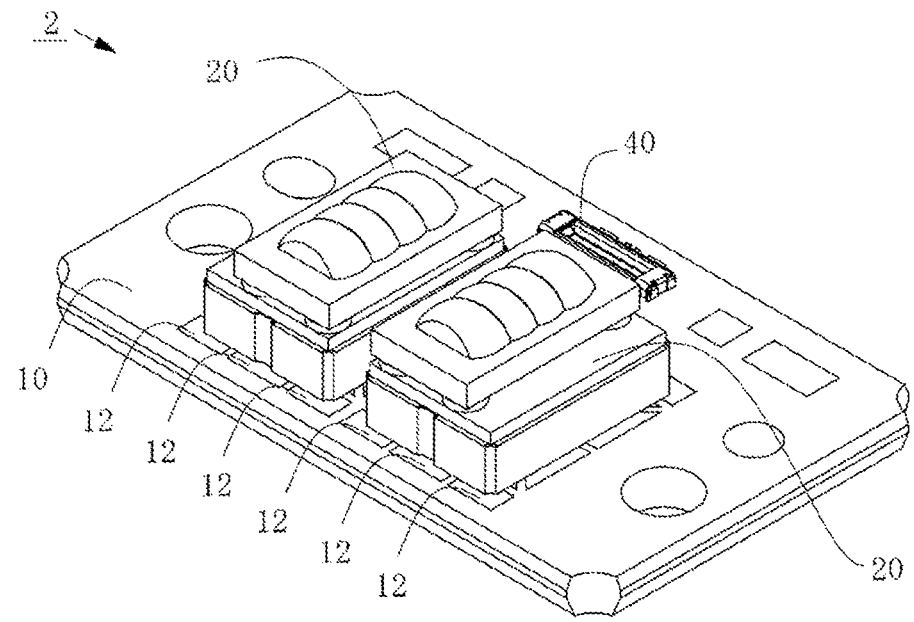
[Fig. 14]
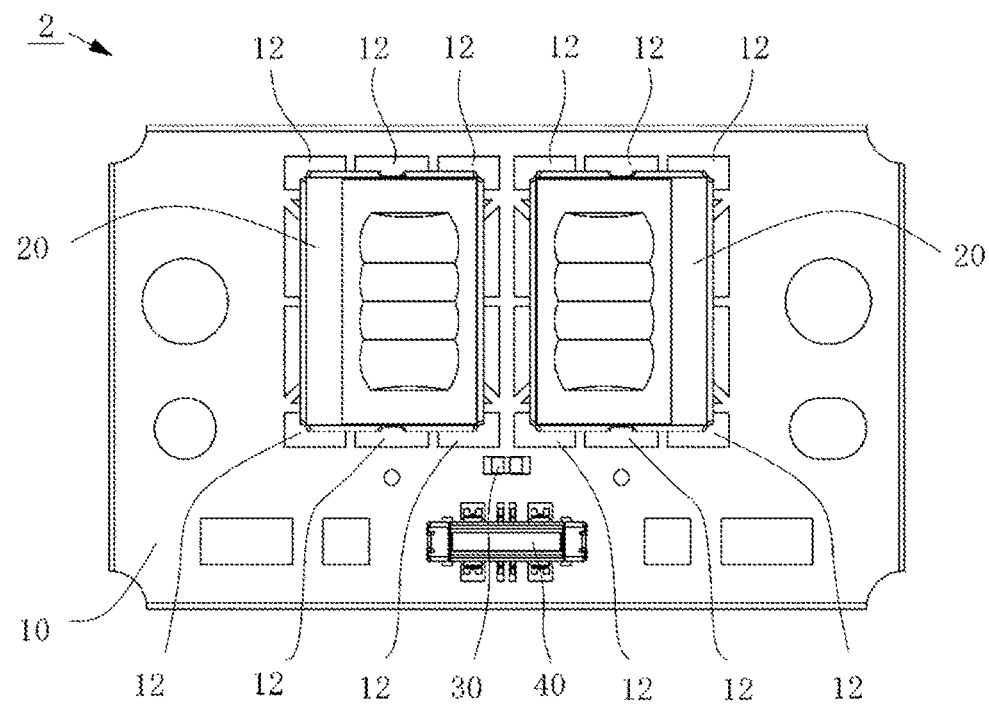

[Fig. 15]
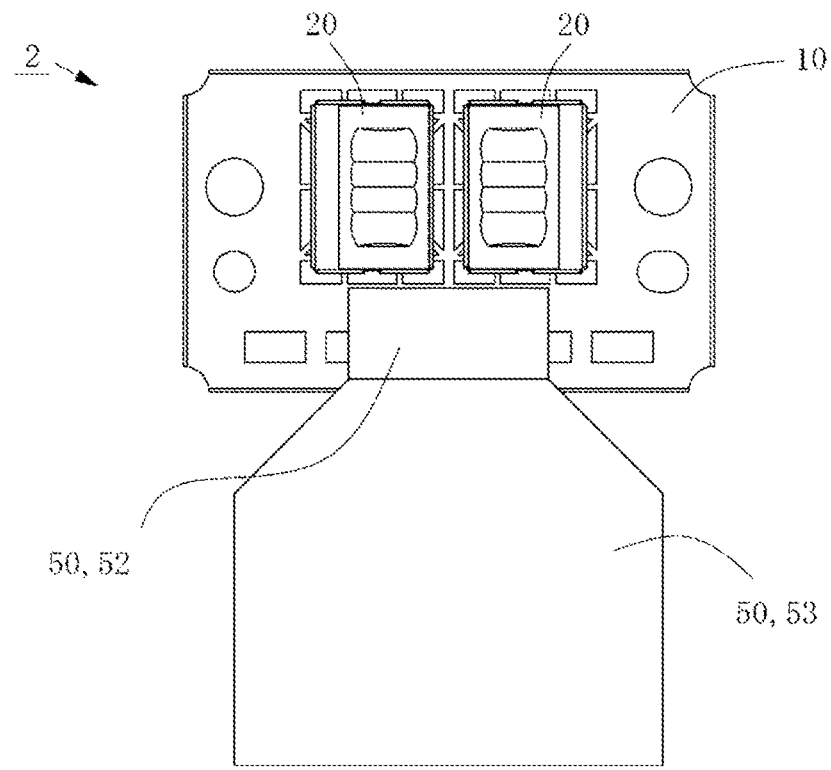
[Fig. 16]
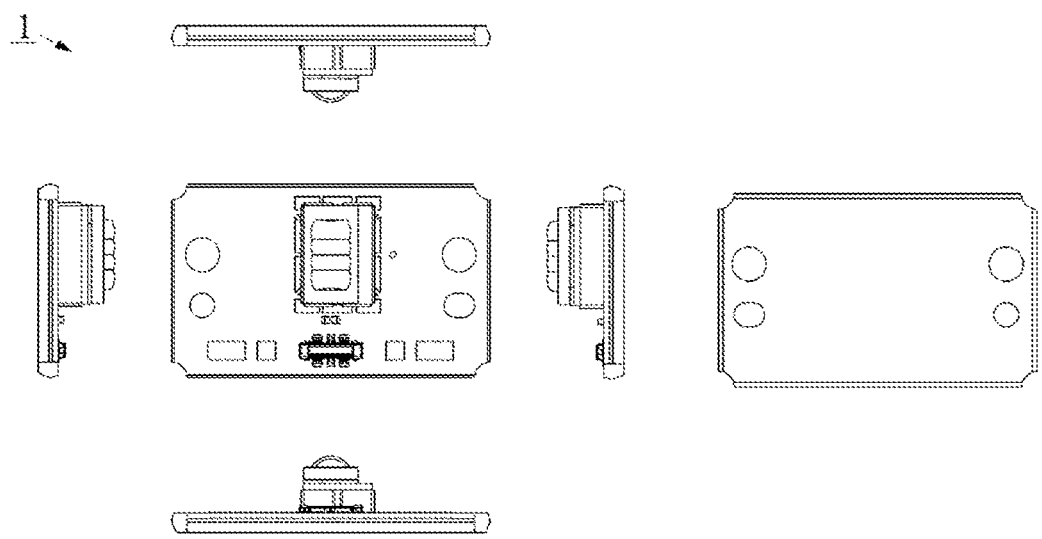

[Fig. 17]
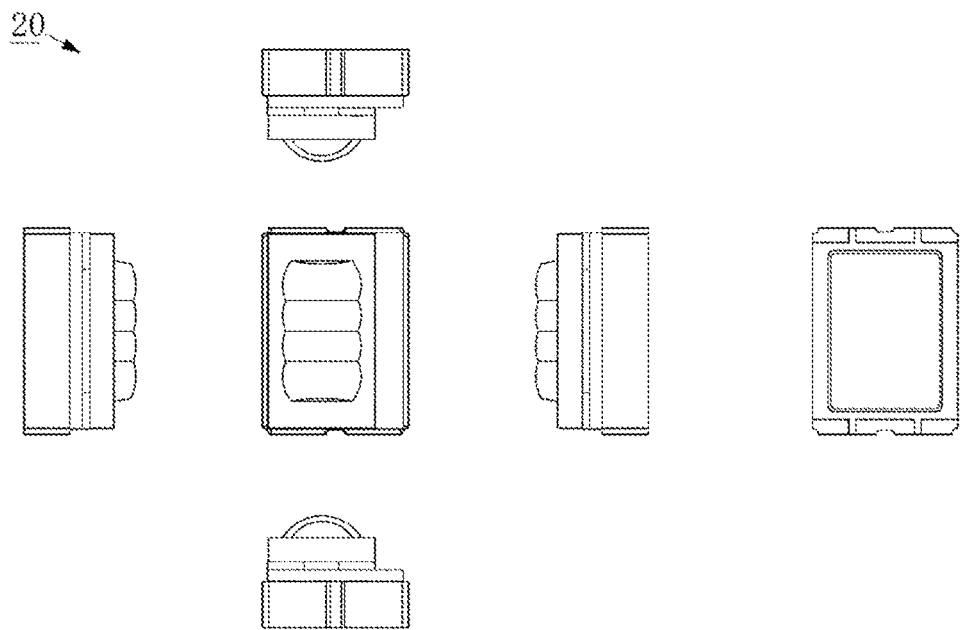
[Fig. 18]
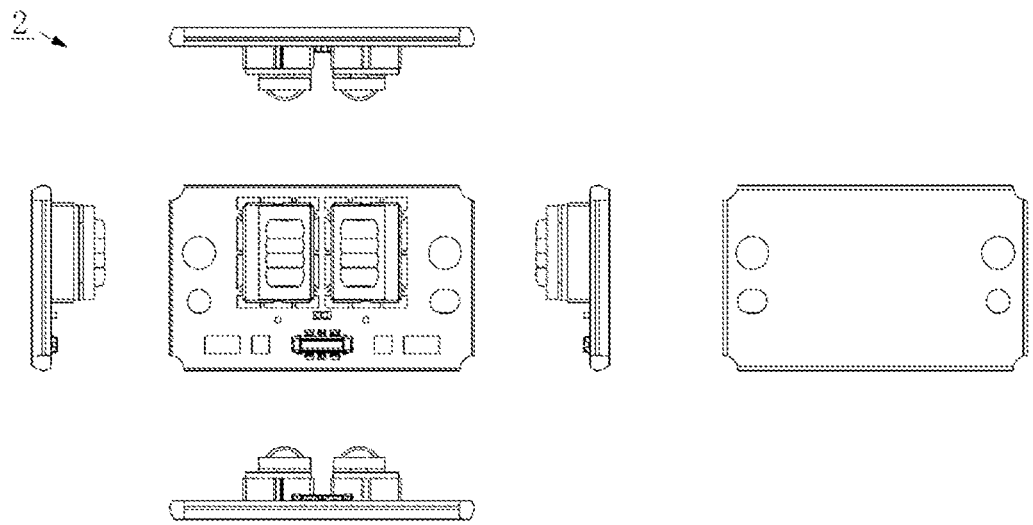

SUBSTRATE MODULE OR LIGHT EMITTING MODULE

CROSS-REFERENCE TO RELATED APPLICATION

This application claims priority to Japanese Patent Application No. 2020-101645, filed on Jun. 11, 2020, the disclosure of which is hereby incorporated by reference in its entirety.

BACKGROUND

The present disclosure relates to a substrate module or a light emitting module.

Japanese Patent Publication No. 2019-153570 discloses a light emitting module in which a light emitting device and a connector are mounted in order to supply power to the light emitting device. With the connector provided, an electrical connection with the light emitting device can be easily made. Further, a thermistor can be provided to the light emitting device to measure a temperature during operation. In this patent publication, a thermistor is disposed in an interior of the light emitting device.

SUMMARY

In Japanese Patent Publication No. 2019-153570, the thermistor is protected from light from outside the light emitting device. However, even in a case in which the thermistor is disposed outside the light emitting device, it may be necessary to protect the thermistor from outside light. Further, the protected object is not limited to a thermistor, and the object from which protection is provided is not limited to light. For components that should be protected from external factors, it is necessary to design a module so that protection can be easily provided, as needed.

According to one embodiment, a substrate module includes: a substrate having a top surface and a bottom surface and comprising, at the top surface, a plurality of first wiring regions and a plurality of second wiring regions that are electrically connected to the plurality of first wiring regions; one or more power receiving devices disposed on the plurality of first wiring regions; a first connection component disposed on the plurality of second wiring regions, wherein the first connection component has opposite ends in a first direction; and a protected component disposed on the top surface of the substrate. In a top plan view, (i) the protected component is located between two straight lines passing through the respective opposite ends of the first connection component and extending in a second direction perpendicular to the first direction, and (ii) the protected component is located between the one or more power receiving devices and the first connection component.

According to another embodiment, a light emitting module includes: a substrate having a top surface and a bottom surface and comprising, at the top surface, a plurality of first wiring regions and a plurality of second wiring regions that are electrically connected to the plurality of first wiring regions; one or more light emitting devices disposed on the plurality of first wiring regions; a protected component disposed on the top surface of the substrate and subject to protection from light in an operating state of the one or more light emitting devices; and a first connection component disposed on the plurality of second wiring regions, wherein the first connection component has opposite ends in a first direction. In a top plan view, (i) the thermistor is disposed between two straight lines passing through both ends of the first connection component in a first direction and extending in a second direction perpendicular to the first direction, and (ii) the thermistor is disposed between the one or more light emitting devices and the first connection component.

According to certain embodiments of the present invention, a module having a structure configured to protect a target component can be achieved.

BRIEF DESCRIPTION OF DRAWINGS

FIG. 1 is a perspective view of a light emitting module according to a first embodiment.

FIG. 2 is a perspective view of the light emitting module according to the first embodiment, viewed from a direction different from that of FIG. 1.

FIG. 3 is a top plan view of the light emitting module according to the first embodiment.

FIG. 4 is a top plan view of the light emitting module according to the first embodiment in a state in which a protected component is protected.

FIG. 5 is a side view of the light emitting module according to the first embodiment in a state in which the protected component is protected.

FIG. 6 is a perspective view of a light emitting device according to the first embodiment.

FIG. 7 is a perspective view of the light emitting device according to the first embodiment, viewed from a direction different from that of FIG. 6.

FIG. 8 is a top plan view of the light emitting device according to the first embodiment.

FIG. 9 is a top plan view for explaining an internal structure of the light emitting device according to the first embodiment.

FIG. 10 is a perspective view of a second connection component according to the first embodiment, viewed from a top surface side.

FIG. 11 is a perspective view of the second connection component according to the first embodiment, viewed from a bottom surface side.

FIG. 12 is a perspective view of a light emitting module according to a second embodiment.

FIG. 13 is a perspective view of the light emitting module according to the second embodiment, viewed from a direction different from that of FIG. 12.

FIG. 14 is a top plan view of the light emitting module according to the second embodiment.

FIG. 15 is a top plan view of the light emitting module according to the second embodiment in a state in which the protected component is protected.

FIG. 16 is a six-sided view of the light emitting module according to the first embodiment.

FIG. 17 is a six-sided view of the light emitting device according to the first embodiment.

FIG. 18 is a six-sided view of the light emitting module according to the second embodiment.

DETAILED DESCRIPTION

In the present specification and claims, polygons such as triangles and quadrangles, including shapes in which the corners of the polygon are rounded, chamfered, beveled, coved, or the like, are referred to as polygons. Further, a shape obtained by processing not only the corners (ends of sides), but also an intermediate portion of a side are similarly referred to as polygons. That is, a shape that is partially processed while the base remains a polygon is included in the interpretation of "polygon" described in the present specification and claims.

The same applies not only to polygons but also to words representing specific shapes such as trapezoids, circles, protrusions, and recessions. Further, the same applies in the treatment of each side forming that shape. That is, even if processing is performed on a corner or an intermediate portion of a certain side, the interpretation of "side" includes the processed portion. Note that when a "polygon" or "side" not partially processed is to be distinguished from a processed shape, "strict" will be added to the description as in, for example, "strict quadrangle".

Further, in the present specification and claims, when there are a plurality of components corresponding to a certain component and each of the components is to be expressed separately, the components may be distinguished by adding the terms first and second in front of the component term. Further, ordinals and viewpoints may differ between the present specification and the present claims. In other words, the same terms in the specification and claims may not refer to the same elements.

For example, in this specification, there are elements distinguished by being terms "first," "second," and "third." However, when a claim refers to only the first and third elements of the specification, the elements termed "first" and "second" in the claims may refer to the elements termed "first" and "third" in the specification.

Embodiments for carrying out the present invention are described below with reference to the drawings. However, the illustrated embodiments are for embodying the technical concepts of the present invention, and are not intended to limit the present invention. Further, in the description below, the same term or reference numeral represents the same member or a similar member, and duplicate descriptions will be omitted as appropriate. Note that sizes, positional relationships, and the like of members illustrated in the drawings may sometimes be exaggerated in order to facilitate understanding.

First Embodiment

A substrate module according to a first embodiment will now be described. FIG. 1 to FIG. 5 are drawings for explaining an exemplary form of the substrate module. Note that, in the drawings, a light emitting module 1, which is an exemplary form of the substrate module, is described. FIG. 1 is a perspective view of the light emitting module 1. FIG. 2 is a perspective view of the light emitting module 1 viewed from a diagonal direction of FIG. 1. FIG. 3 is a top plan view of the light emitting module 1. FIG. 4 is a top plan view illustrating an example of the light emitting module 1 in a state in which a second connection component is connected. FIG. 5 is a side view of the light emitting module 1 corresponding to FIG. 4.

FIG. 6 to FIG. 9 are drawings for explaining an exemplary form of a power receiving device mounted onto the substrate module. Note that, in the drawings, a light emitting device 20, which is an exemplary form of the power receiving device, is described. FIG. 6 is a perspective view of the light emitting device 20. FIG. 7 is a perspective view of the light emitting device 20 viewed from a diagonal direction of FIG. 6. FIG. 8 is a top plan view of the light emitting device 20. FIG. 9 is a top plan view of a region in which a light emitting element 24 is disposed in the light emitting device 20.

FIG. 10 and FIG. 11 are drawings for explaining an exemplary form of a second connection component 50 of the substrate module. FIG. 10 is a perspective view of the second connection component 50 viewed from a top surface side. FIG. 11 is a perspective view of the second connection component 50 viewed from a bottom surface side.

The substrate module includes a substrate 10, one or more of the power receiving devices, a protected component, and a connection component 40. In the illustrated light emitting module 1, the light emitting device 20 is employed as the power receiving device. A thermistor 30 is employed as the protected component.

The substrate module can include another connection component 50 connected to the connection component 40. When these two connection components are to be distinguished in a description, the components are referred to as the first connection component 40 and the second connection component 50. Hereinafter, each component will be described, and then the substrate module will be described.

Substrate 10

The substrate 10 has a top surface and a bottom surface. The substrate 10 is formed with a plate-like shape and has a rectangular shape in a top plan view. Other components are disposed on the top surface of the substrate 10. A plurality of wiring regions 11 are located the top surface of the substrate 10. One or a plurality of through-holes 15 extending in a vertical direction are formed in the substrate 10.

Power Receiving Device

The power receiving device includes a bottom surface. The power receiving device is a device that operates upon reception of a supply of power from outside the substrate module. The power receiving device includes an electronic component that operates by receiving a supply of electricity from an external power source. In the illustrated light emitting module 1, the light emitting element 24 is employed as the electronic component, but the electronic component need not be limited to the light emitting element 24. The electronic component can be a component without a light emitting function.

Protected Component

The protected component includes a bottom surface. The protected component is a component to be protected in an environment in which the power receiving device is operating in the substrate module. The protected component is a component to be protected from the influence of the power receiving device or from influences outside of the substrate module in the environment in which the power receiving device is operating. In the illustrated light emitting module 1, the thermistor 30 is employed as the protected component, but the protected component need not be limited to the thermistor 30. For example, a Zener diode can be the protected component.

First Connection Component 40

The first connection component 40 includes a bottom surface. The first connection component 40 includes a connection portion 41. The second connection component 50 is connected to the connection portion 41. The connection portion 41 is provided on a top surface side of the first connection component 40. Note that the connection portion 41 can be provided on a lateral surface side of the first connection component 40.

Second Connection Component 50

The second connection component 50 includes a connection portion 51 that is connected to the first connection component 40. When the connection portions of the first connection component 40 and the second connection component 50 are to be distinguished in a description, the connection portions are respectively referred to as the first connection portion 41 and the second connection portion 51. The first connection component 40 is connected to the second connection portion 51. The second connection portion 51 is connected to the first connection portion 41.

The second connection component 50 includes a protection portion 52. The protection portion 52 is provided above the second connection portion 51. The protection portion 52, in a top plan view, is larger in size than the second connection portion 51. The protection portion 52, in a top plan view, covers the second connection portion 51.

The protection portion 52 protects the protected component in an environment in which the power receiving device is operating. Accordingly, the protection portion 52 has properties that protect the protected component. For example, the protection portion 52 has light shielding properties. Thus, the protected component is protected from the influence of light. For example, the protection portion 52 is a material having good heat dissipation. Thus, the protected component is protected from the influence of heat. For example, the protection portion 52 can be formed from a plate-like metal.

The second connection component 50 includes a wiring part 53. The wiring part 53 is, for example, a flexible printed circuit board. The wiring part 53 is electrically connected to the second connection portion 51. The second connection portion 51 is disposed on a bottom surface of the wiring part 53.

The protection portion 52 is disposed on a top surface of the wiring part 53. The protection portion 52 is connected to the top surface of the wiring part 53. The wiring part 53, in a top plan view, is formed with an elongated shape. The second connection portion 51 is connected to the bottom surface of the wiring part 53 at a tip end portion of the wiring part 53 extending in an elongated matter. The protection portion 52 extends further beyond the leading end of the wiring part 53 where the second connection portion 51 is connected. Accordingly, the protection portion 52 includes, in a top plan view, a region overlapping the second connection portion 51 and a region not overlapping the second connection portion 51. The second connection portion 51 is not exposed in a top plan view. The protection portion 52 includes, in a top plan view, a region overlapping the wiring part 53 and a region not overlapping the wiring part 53. In a top plan view, the wiring part 53 is not exposed.

Substrate Module

In the substrate module, the one or more power receiving devices, the protected component, and the first connection component 40 are mounted onto the substrate 10. The bottom surface of each of the power receiving devices is joined to the top surface of the substrate 10. The bottom surface of the protected component is joined to the top surface of the substrate 10. The bottom surface of the first connection component 40 is joined to the top surface of the substrate 10.

The one or more power receiving devices and the first connection component 40 are disposed on the plurality of wiring regions 11 of the substrate 10. Thus, the one or more power receiving devices and the first connection component 40 are electrically connected. The protected component and the first connection component 40 are disposed on the plurality of wiring regions 11 of the substrate 10. Thus, the protected component and the first connection component 40 are electrically connected.

Here, of the plurality of wiring regions 11, the wiring region 11 on which the power receiving device is disposed is referred to as a first wiring region 12, the wiring region 11 on which the first connection component 40 is disposed is referred to as a second wiring region 13, and the wiring region 11 on which the protected component is disposed is referred to as a third wiring region 14.

The substrate 10 includes a plurality of the first wiring regions 12, and the one or more power receiving devices are disposed on the plurality of first wiring regions 12. The substrate 10 includes a plurality of the second wiring regions 13, and the first connection component 40 is disposed on the plurality of second wiring regions 13. The substrate 10 includes a plurality of the third wiring regions 14, and the protected component is disposed on the plurality of third wiring regions 14. The plurality of first wiring regions 12 and the plurality of second wiring regions 13 are electrically connected. The plurality of second wiring regions 13 and the plurality of third wiring regions 14 are electrically connected.

The protected component is disposed on a top plan view, between the one or more power receiving devices and the first connection component 40. The protected component is interposed between a lateral surface of the power receiving device and a lateral surface of the first connection component 40 facing each other. The protected component is disposed, in a top plan view, between two planes respectively including the lateral surface of the power receiving device and the lateral surface of the first connection component 40 facing each other.

Here, in a top plan view, a direction parallel to the lateral surface of the first connection component 40 facing the power receiving device is a first direction, and a perpendicular direction is a second direction. At this time, the protected component is disposed, in a top plan view, between two straight lines that pass through the respective opposite ends of the first connection component 40 in the first direction and extend in the second direction.

The protected component is disposed, in a top plan view, between two straight lines that pass through both ends of the one or more power receiving devices in the first direction and extend in the second direction. In a top plan view, each lateral surface of the one or more power receiving devices facing the lateral surface of the first connection component 40 is parallel to the first direction.

In a top plan view, a virtual straight line parallel to the first direction and passing through the first wiring region 12 does not pass through the second wiring region 13. In a top plan view, the virtual straight line parallel to the first direction and passing through the first wiring region 12 does not pass through the third wiring region 14. In a top plan view, a virtual straight line parallel to the first direction and passing through the second wiring region 13 does not pass through the third wiring region 14.

In a top plan view, there exists a virtual straight line parallel to the second direction and passing through the first wiring region 12 and the second wiring region 13. That is, the first wiring region 12 is provided at a position, in a top plan view, spaced from the second wiring region 13 in a direction orthogonal to the first direction. In a top plan view, there exists a virtual straight line parallel to the second direction and passing through the first wiring region 12, the second wiring region 13, and the third wiring region 14. That is, the third wiring region 14 is provided at a position, in a top plan view, spaced from the second wiring region 13 in a direction orthogonal to the first direction.

In a top plan view, among the plurality of second wiring regions 13, a plurality of the second wiring regions electrically connected to the third wiring region 14 are provided between two of the second wiring regions 13 electrically connected to the first wiring region 12. The plurality of second wiring regions electrically connected to the third wiring region 14 are provided between these two second wiring regions 13 in the first direction.

Apart from the first wiring region 12, the second wiring region 13, and the third wiring region 14, the plurality of wiring regions 11 includes a plurality of the wiring regions 11 provided at positions spaced from the plurality of second wiring regions 13 in the first direction. This plurality of wiring regions 11 includes one or a plurality of pairs of the wiring regions 11 that sandwich the plurality of second wiring regions 13 in the first direction.

Each of the pairs of wiring regions 11 is electrically connected to the first wiring region 12. Each of the pairs of wiring regions 11 is electrically connected to the third wiring region 14. The one or plurality of pairs of wiring regions 11 are electrically connected to the plurality of second wiring regions 13.

Electrical connection with the power receiving device can be made by this pair of wiring regions 11 without passing through the first connection component 40. Electrical connection with the protected component can be made by this pair of wiring regions 11 without passing through the first connection component 40. This pair of wiring regions 11 can be used, for example, in a case in which the operation of the power receiving device or the protected component needs to be checked without passing through the first connection component 40.

For each of the one or plurality of pairs of wiring regions 11, one wiring region 11 is provided at a position spaced from the second wiring region 13 in the first direction, and the other wiring region 11 is provided at a position spaced from the second wiring region 13 in the first direction and opposite to the one wiring region 11.

The second connection component 50 is connected to the substrate module onto which the one or more power receiving devices, the protected component, and the first connection component 40 are mounted. The second connection portion 51 is connected to the first connection portion 41, thereby electrically connecting the second connection component 50 to the one or more power receiving devices. Power is supplied to the one or more power receiving devices via the second connection component 50. The second connection component 50 is electrically connected to the protected component, and power is supplied to the protected component via the second connection component 50.

When the first connection component 40 and the second connection component 50 are connected, the protection portion 52 is disposed above the protected component. In the protection portion 52, in a top plan view, the region not overlapping the second connection portion 51 is disposed above the protected component. In the protection portion 52, in a top plan view, the region not overlapping the wiring part 53 is disposed above the protected component.

The protection portion 52 is disposed at a position not in contact with the one or more power receiving devices. The protected component is disposed between the one or more power receiving devices and the first connection component 40, making it possible to protect the protected component by the second connection component 50 including the protection portion 52.

In the substrate module with the second connection component 50 connected, the protected component is covered by the protection portion 52 in a top plan view. A height from the top surface of the substrate 10 to the protection portion 52 of the second connection component 50 connected to the first connection component 40 is greater than a height from the top surface of the substrate 10 to a top surface of the protected component. Thus, the protection portion 52 can protect the protected component while avoiding contact with the protected component.

The height from the top surface of the substrate 10 to the protection portion 52 of the second connection component 50 connected to the first connection component 40 is less than a height from the top surface of the substrate 10 to a top surface of the power receiving device. Thus, the protection portion 52 can be provided at a position lower than that of the top surface of the power receiving device, and the protected component can be protected from the influence of the power receiving device. For example, in a case in which the power receiving device is the light emitting device 20, such as in the illustrated light emitting module, when the protection portion 52 is positioned higher than the top surface of the power receiving device, a portion of the light emitted from a top surface of the light emitting device 20 is likely to be emitted onto the bottom surface of the protection portion 52 and travel to the protected component.

Here, the light emitting device 20, which is an example of the power receiving device, will be described. The light emitting device 20 includes, as components, a package 21, one or a plurality of the light emitting elements 24, one or a plurality of reflecting members 25, a plurality of wires 26, an optical member 27, and an adhesive 28.

The package 21 includes a base part 22 and a lid member 23, and the light emitting element 24 is sealed by joining the lid member 23 to the base part 22 with the light emitting element 24 and the reflecting member 25 disposed on the base part 22. Thus, the light emitting element 24 can be disposed in a closed space that is vacuum-sealed or hermetically sealed.

In the illustrated example of the light emitting device 20, four of the light emitting elements 24 are disposed side-by-side. Further, four of the reflecting members 25 are disposed side-by-side. The light emitting elements 24 and the reflecting members 25 are provided in a one-to-one correspondence. The light emitting elements 24 are electrically connected to the package 21 by the plurality of wires 26. Thus, the light emitting element 24 can receive a supply of power from outside the substrate module via the package 21.

Light emitted from the light emitting elements 24 is reflected by the reflecting members 25 and travels upwards. The light traveling upwards passes through the lid member 23 and is emitted outside of the package 21. The light emitted outside the package 21 passes through the optical member 27 and is emitted upward from lens surfaces of the optical member 27.

The lens surfaces having a one-to-one correspondence with the light emitting elements 24 are provided on a top surface of the optical member 27. Light emitted from the light emitting element 24 and passing through this lens surface becomes collimated light and is emitted from the optical member 27.

The optical member 27 is joined to the lid member 23 by the adhesive 28. Further, two types of the adhesive 28, a first adhesive 281, and a second adhesive 282, are used to join the optical member 27 and the lid member 23. For example, the first adhesive 281 is an ultraviolet curing resin, and the second adhesive 282 is a thermosetting resin. The combination of the first adhesive 281 and the second adhesive 282 is not limited thereto.

A semiconductor laser element can be employed for the light emitting element 24. Further, for example, a semiconductor laser element that emits blue light can be employed. Note that the semiconductor laser element can be a semiconductor laser element that emits light other than blue. Here, blue light refers to light having an emission peak wavelength within a range from 420 nm to 494 nm. Examples of the semiconductor laser element that emits blue light include a semiconductor laser element including a nitride semiconductor. GaN, InGaN, and AlGaN, for example, can be used as the nitride semiconductor.

In the light emitting module 1 in which the light emitting device 20 and the thermistor 30 are mounted onto the substrate 10, light emitted upward from the top surface of the light emitting device 20 may be reflected from an object further ahead and returned to the substrate module. At this time, the thermistor 30 can be protected from the returning light by the protection portion 52 of the second connection component 50. Note that the protected object need not be limited to the thermistor 30. The protected component in the light emitting module 1 is a component to be protected from light in the operating state of the light emitting device.

Second Embodiment

Next, a substrate module according to a second embodiment will be described. FIG. 12 to FIG. 15 are drawings for explaining an exemplary form of the substrate module. Note that, in the drawings, a light emitting module 2, which is an exemplary form of the substrate module, is described. FIG. 12 is a perspective view of the light emitting module 2. FIG. 13 is a perspective view of the light emitting module 2 viewed from a diagonal direction of FIG. 12. FIG. 14 is a top plan view of the light emitting module 2. FIG. 15 is a top plan view illustrating an example of the light emitting module 2 in a state in which a second connection component is connected.

This substrate module differ from the substrate module according to the first embodiment in that the plurality of power receiving devices are disposed side-by-side in the first direction. In the illustrated example of the light emitting module 2, two of the power receiving devices are disposed side-by-side in the first direction. Note that, in the substrate module, the number of power receiving devices arranged side-by-side need not be limited to two.

The lateral surfaces of the plurality of power receiving devices that face the lateral surface of the first connection component 40 are provided on the same plane. Distances in the second direction between the lateral surface of the first connection component 40 and the lateral surfaces of the power receiving devices facing each other are the same for each of the plurality of power receiving devices.

The plurality of power receiving devices are disposed line-symmetrically with respect to a straight line parallel to the second direction in a top plan view. In the illustrated example of the light emitting module 2, the light emitting devices 20 are disposed so that the lens surfaces of the optical member 27 are close to each other. In a top plan view, the optical member 27 is disposed closer to one lateral surface of the light emitting device 20. The plurality of power receiving devices include two power receiving devices having the same distance to the protected component. The plurality of power receiving devices include two power receiving devices having the same distance to the first connection component 40. The two power receiving devices having the same distance to the protected component and the two power receiving devices having the same distance to the first connection component 40 are the same two power receiving devices. In a case in which the plurality of power receiving devices aligned in the first direction, the protected component, and the first connection component 40 are disposed in this way, and, with respect to the substrate module as well, the second connection component 50 is connected to the first connection component 40, the protection portion 52 can protect the protected component in the same manner.

As stated above, the present invention having the technical features disclosed in the specification is not necessarily limited to the structure described in the embodiments of the specification. For example, the present invention can be applied to a substrate module including components not disclosed in the embodiments, and a difference from the disclosed structure does not constitute a basis for not being able to apply the present invention. Further, in terms of the minimum number of components for completing the invention, it can be said that the described embodiments of the substrate module can include components not required.

This means that the substrate modules disclosed according to the embodiments of this specification each include not only a viewpoint of completion of the invention but also a viewpoint of disclosure of a rational configuration that assumes one form of usage. The invention works effectively by being applied to the exemplary forms of usage, but the application of the invention is not limited to these forms of usage.

From such a point of view, it may not be essential to include all of the components disclosed in one embodiment in the present invention. For example, in a case in which a portion of the components of the substrate module disclosed by an embodiment are not stated in the claims, the components are not limited to those disclosed in the embodiment, and there is a degree of freedom in design by those skilled in the art, such as substitutions, omissions, shape modifications, and material changes, which demands that the invention recited in the claims is applied thereupon.

Further, to specify the structure of each specific form of the light emitting module and the light emitting device in more detail, FIG. 16 to FIG. 18 illustrate six-sided views of the light emitting module 1, the light emitting device 20, and the light emitting module 2, respectively. Note that the light emitting device 20 in which the light emitting element 24 is a semiconductor laser element can be referred to as a laser package. Further, the light emitting module 1 and the light emitting module 2 including the light emitting device 20 in which the light emitting element 24 is a semiconductor laser element can be referred to as a laser package module.

The light emitting module described in the embodiments can be utilized in a projector. That is, the projector can be said to be one form of usage to which the present invention is applied. Note that the present invention is not limited thereto, and can be utilized in on-vehicle headlights, head-mounted displays, lights, displays, and the like. Furthermore, the substrate module can also be utilized in a substrate module of an electronic circuit or an information processing device such as a computer.

What is claimed is:

1. A substrate module comprising:
a substrate having a top surface and a bottom surface and comprising, at the top surface, a plurality of first wiring regions and a plurality of second wiring regions that are electrically connected to the plurality of first wiring regions;
one or more power receiving devices disposed on the plurality of first wiring regions;
a first connection component disposed on the plurality of second wiring regions, wherein the first connection component has opposite ends in a first direction; and
a protected component disposed on the top surface of the substrate;
wherein, in a top plan view, (i) the protected component is located between two straight lines passing through the respective opposite ends of the first connection component and extending in a second direction perpendicular to the first direction, and (ii) the protected component is located between the one or more power receiving devices and the first connection component.

2. The substrate module according to claim 1, wherein:
the one or more power receiving devices are light emitting devices.

3. The substrate module according to claim 1, wherein:
the protected component is a thermistor.

4. The substrate module according to claim 1, wherein:
the first connection component comprises a first connection portion; and
the substrate module further comprises a second connection component comprising:
 a second connection portion connected to the first connection portion, and
 a protection portion disposed above the protected component, wherein the second connection component is configured to supply power to the one or more power receiving devices.

5. The substrate module according to claim 4, wherein:
the protection portion includes, in a top plan view, a region overlapping the second connection portion and a region not overlapping the second connection portion; and
the region not overlapping the second connection portion is disposed above the protected component.

6. The substrate module according to claim 4, wherein:
the second connection component further comprises a wiring part;
the second connection portion is connected to a bottom surface of the wiring part;
the protection portion is connected to a top surface of the wiring part and includes, in a top plan view, a region overlapping the wiring part and a region not overlapping the wiring part; and
the region not overlapping the wiring part is disposed above the protected component.

7. The substrate module according to claim 6, wherein:
the wiring part is a flexible printed circuit board.

8. The substrate module according to claim 1, wherein:
the substrate further comprises one or more third wiring regions at the top surface, and, in a top plan view, each of the one or more third wiring regions is disposed at a position spaced from the plurality of second wiring regions in the first direction;
the substrate further comprises one or more fourth wiring regions at the top surface, and, in a top plan view, each of the one or more fourth wiring regions is disposed at a position spaced from the plurality of second wiring regions in the first direction and opposite to the one or more third wiring regions;
in a top plan view, the plurality of first wiring regions are provided at positions spaced from the plurality of second wiring regions in the second direction; and
the one or more third wiring regions and the one or more fourth wiring regions are electrically connected to the plurality of second wiring regions.

9. A light emitting module comprising:
a substrate having a top surface and a bottom surface and comprising, at the top surface, a plurality of first wiring regions and a plurality of second wiring regions that are electrically connected to the plurality of first wiring regions;
one or more light emitting devices disposed on the plurality of first wiring regions;
a protected component disposed on the top surface of the substrate and subject to protection from light in an operating state of the one or more light emitting devices; and
a first connection component disposed on the plurality of second wiring regions, wherein the first connection component has opposite ends in a first direction,
wherein, in a top plan view, (i) the protected component is disposed between two straight lines passing through the respective opposite ends of the first connection component in a first direction and extending in a second direction perpendicular to the first direction, and (ii) the protected component is disposed between the one or more light emitting devices and the first connection component.

* * * * *